United States Patent
Alpeggiani et al.

(10) Patent No.: US 12,025,925 B2
(45) Date of Patent: Jul. 2, 2024

(54) METROLOGY METHOD AND LITHOGRAPHIC APPARATUSES

(71) Applicant: ASML Netherlands B.V., Veldhoven (NL)

(72) Inventors: Filippo Alpeggiani, Eindhoven (NL); Henricus Petrus Maria Pellemans, Veldhoven (NL); Sebastianus Adrianus Goorden, Eindhoven (NL); Simon Reinald Huisman, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 17/773,384

(22) PCT Filed: Oct. 19, 2020

(86) PCT No.: PCT/EP2020/079372
§ 371 (c)(1),
(2) Date: Apr. 29, 2022

(87) PCT Pub. No.: WO2021/083704
PCT Pub. Date: May 6, 2021

(65) Prior Publication Data
US 2022/0397832 A1    Dec. 15, 2022

(30) Foreign Application Priority Data

Nov. 1, 2019 (EP) .................................. 19206747
Jan. 28, 2020 (EP) .................................. 20154007
Apr. 20, 2020 (EP) .................................. 20170482

(51) Int. Cl.
G03F 7/20    (2006.01)
G03F 7/00    (2006.01)
G03F 9/00    (2006.01)

(52) U.S. Cl.
CPC ........ G03F 9/7046 (2013.01); G03F 7/70091 (2013.01); G03F 7/70133 (2013.01); G03F 7/70516 (2013.01)

(58) Field of Classification Search
CPC ............... G03F 9/7046; G03F 7/70091; G03F 7/70133; G03F 7/70516; G03F 9/7092; G03F 9/7088
See application file for complete search history.

(56) References Cited

U.S. PATENT DOCUMENTS 6,961,116 B2    11/2005    Den Boef et al.
10,247,940 B2    4/2019    Sobolev
(Continued)

FOREIGN PATENT DOCUMENTS

TW    2017-30622 A    9/2017
WO    WO 2009/078708 A1    6/2009
(Continued)

OTHER PUBLICATIONS

International Search Report and Written Opinion of the International Searching Authority directed to related International Patent Application No. PCT/EP2020/079372, dated Jan. 25, 2021; 8 pages.
(Continued)

*Primary Examiner* — Mesfin T Asfaw
(74) *Attorney, Agent, or Firm* — Sterne, Kessler, Goldstein & Fox P.L.L.C.

(57) ABSTRACT

Disclosed is a method of metrology such as alignment metrology. The method comprises obtaining pupil plane measurement dataset at a pupil plane relating to scattered radiation resultant from a measurement of a structure. The method comprises determining a measurement value or correction therefor using the pupil plane measurement dataset and a sensor term relating to sensor optics used to perform said measurement.

33 Claims, 8 Drawing Sheets

(56) References Cited

U.S. PATENT DOCUMENTS

| | | |
|---|---|---|
| 2001/0026368 A1 | 10/2001 | Mikami |
| 2006/0033921 A1 | 2/2006 | Den Boef et al. |
| 2006/0066855 A1 | 3/2006 | Boef et al. |
| 2008/0043212 A1 | 2/2008 | Shibazaki |
| 2009/0195768 A1 | 8/2009 | Bijnen et al. |
| 2010/0201963 A1 | 8/2010 | Cramer et al. |
| 2011/0013165 A1 | 1/2011 | Kaneko et al. |
| 2011/0027704 A1 | 2/2011 | Cramer et al. |
| 2011/0043791 A1 | 2/2011 | Smilde et al. |
| 2011/0102753 A1 | 5/2011 | Van De Kerkhof et al. |
| 2012/0044470 A1 | 2/2012 | Smilde et al. |
| 2012/0123581 A1 | 5/2012 | Smilde et al. |
| 2013/0258310 A1 | 10/2013 | Smilde et al. |
| 2013/0271740 A1 | 10/2013 | Quintanilha |
| 2015/0261097 A1 | 9/2015 | Mathijssen et al. |
| 2015/0355554 A1 | 12/2015 | Mathijssen |
| 2017/0256465 A1* | 9/2017 | Van Leest ............ G03F 7/70633 |
| 2018/0173113 A1 | 6/2018 | Schmetz-Schagen et al. |
| 2019/0025714 A1 | 1/2019 | Pisarenco et al. |
| 2019/0094721 A1 | 3/2019 | Tinnemans et al. |
| 2019/0285996 A1 | 9/2019 | Shibayama et al. |
| 2019/0295902 A1 | 9/2019 | Toshima et al. |

FOREIGN PATENT DOCUMENTS

| | | |
|---|---|---|
| WO | WO 2009/106279 A1 | 9/2009 |
| WO | WO 2013/178422 A1 | 12/2013 |
| WO | WO 2015/051970 A1 | 4/2015 |
| WO | WO 2018/046272 A1 | 3/2018 |
| WO | WO 2018/114152 A1 | 6/2018 |
| WO | WO 2020/057900 A1 | 3/2020 |

OTHER PUBLICATIONS

International Preliminary Report on Patentability directed to related International Patent Application No. PCT/EP2020/079372, dated May 3, 2022; 6 pages.

* cited by examiner

METROLOGY METHOD AND LITHOGRAPHIC APPARATUSES

CROSS-REFERENCE TO RELATED APPLICATION

The application claims priority of EP application 19206747.8 which was filed on Nov. 1, 2019, EP application 20154007.7 which was filed on Jan. 28, 2020 and EP application 20170482.2 which was filed on Apr. 20, 2020, and which are incorporated herein in its entirety by reference.

FIELD

The present invention relates to methods and apparatus usable, for example, in the manufacture of devices by lithographic techniques, and to methods of manufacturing devices using lithographic techniques. The invention relates to metrology devices, and more specifically metrology devices used for measuring position such as alignment sensors and lithography apparatuses having such an alignment sensor.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of a die, one die, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. These target portions are commonly referred to as "fields".

In the manufacture of complex devices, typically many lithographic patterning steps are performed, thereby forming functional features in successive layers on the substrate. A critical aspect of performance of the lithographic apparatus is therefore the ability to place the applied pattern correctly and accurately in relation to features laid down (by the same apparatus or a different lithographic apparatus) in previous layers. For this purpose, the substrate is provided with one or more sets of alignment marks. Each mark is a structure whose position can be measured at a later time using a position sensor, typically an optical position sensor. The lithographic apparatus includes one or more alignment sensors by which positions of marks on a substrate can be measured accurately. Different types of marks and different types of alignment sensors are known from different manufacturers and different products of the same manufacturer.

In other applications, metrology sensors are used for measuring exposed structures on a substrate (either in resist and/or after etch). A fast and non-invasive form of specialized inspection tool is a scatterometer in which a beam of radiation is directed onto a target on the surface of the substrate and properties of the scattered or reflected beam are measured. Examples of known scatterometers include angle-resolved scatterometers of the type described in US2006033921A1 and US2010201963A1. In addition to measurement of feature shapes by reconstruction, diffraction based overlay can be measured using such apparatus, as described in published patent application US2006066855A1. Diffraction-based overlay metrology using dark-field imaging of the diffraction orders enables overlay measurements on smaller targets. Examples of dark field imaging metrology can be found in international patent applications WO 2009/078708 and WO 2009/106279 which documents are hereby incorporated by reference in their entirety. Further developments of the technique have been described in published patent publications US20110027704A, US20110043791A, US2011102753A1, US20120044470A, US20120123581A, US20130258310A, US20130271740A and WO2013178422A1. These targets can be smaller than the illumination spot and may be surrounded by product structures on a wafer. Multiple gratings can be measured in one image, using a composite grating target. The contents of all these applications are also incorporated herein by reference.

In some metrology applications, such as in position metrology using alignment sensors, a phase difference between different diffraction orders arises due to the light probing different optical aberrations of the optical system. Where this is constant (intra-wafer and between wafers) it can be quantified and calibrated for. However, where this induced phase difference is process dependent and/or stack dependent, present calibration methods are insufficient, resulting in alignment errors.

It would be desirable to address this issue and improve correction for such sensor aberration induced error.

SUMMARY

The invention in a first aspect provides a method of metrology comprising: obtaining pupil plane measurement dataset at a pupil plane relating to scattered radiation resultant from a measurement of a structure; and determining a measurement value or correction therefor using the pupil plane measurement dataset and a sensor term relating to sensor optics used to perform said measurement.

Also disclosed is a computer program, metrology apparatus and a lithographic apparatus being operable to perform the method of the first aspect.

The above and other aspects of the invention will be understood from a consideration of the examples described below.

BRIEF DESCRIPTION OF THE DRAWINGS

Embodiments of the invention will now be described, by way of example only, with reference to the accompanying drawings, in which.

DETAILED DESCRIPTION

Before describing embodiments of the invention in detail, it is instructive to present an example environment in which embodiments of the present invention may be implemented.

Figure 1:
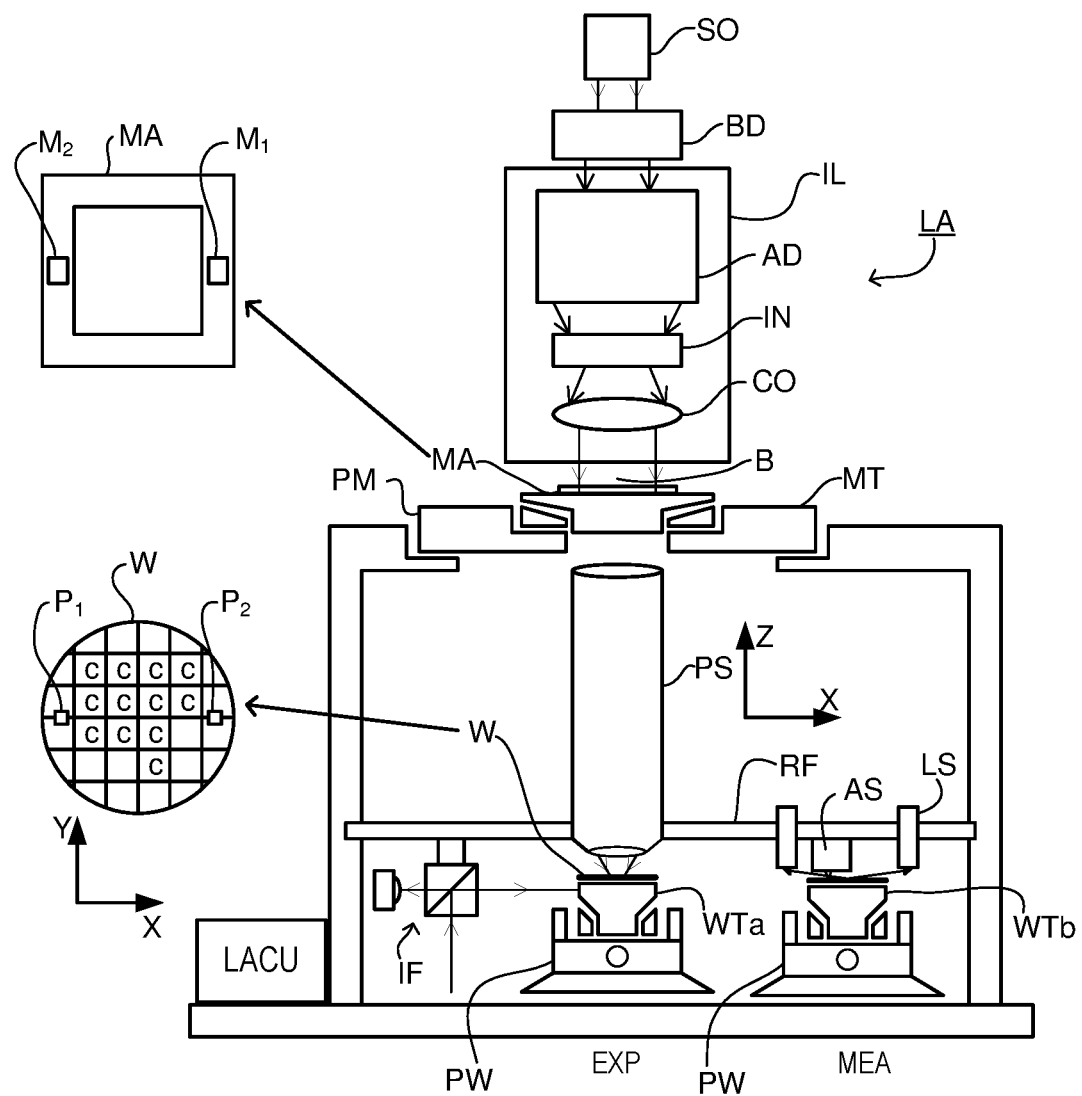
FIG. 1 depicts a lithographic apparatus.

FIG. 1 schematically depicts a lithographic apparatus LA. The apparatus includes an illumination system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; two substrate tables (e.g., a wafer table) WTa and WTb each constructed to hold a substrate (e.g., a resist coated wafer) W—the terms wafer and substrate will be used synonymously throughout—and each connected to a second positioner $\mu$W configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W. A reference frame RF connects the various components, and serves as a reference for setting and measuring positions of the patterning device and substrate and of features on them.

The illumination system may include various types of optical components, such as refractive, reflective, magnetic, electromagnetic, electrostatic or other types of optical components, or any combination thereof, for directing, shaping, or controlling radiation.

The patterning device support MT holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support MT may be a frame or a table, for example, which may be fixed or movable as required. The patterning device support may ensure that the patterning device is at a desired position, for example with respect to the projection system.

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

As here depicted, the apparatus is of a transmissive type (e.g., employing a transmissive patterning device). Alternatively, the apparatus may be of a reflective type (e.g., employing a programmable mirror array of a type as referred to above, or employing a reflective mask). Examples of patterning devices include masks, programmable mirror arrays, and programmable LCD panels. Any use of the terms "reticle" or "mask" herein may be considered synonymous with the more general term "patterning device." The term "patterning device" can also be interpreted as referring to a device storing in digital form pattern information for use in controlling such a programmable patterning device.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems.

In operation, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may for example include an adjuster AD for adjusting the angular intensity distribution of the radiation beam, an integrator IN and a condenser CO. The illuminator may be used to condition the radiation beam, to have a desired uniformity and intensity distribution in its cross section.

The radiation beam B is incident on the patterning device MA, which is held on the patterning device support MT, and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WTa or WTb can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment marks may also be included within dies, in amongst the device features, in which case it is desirable that the markers be as small as possible and not require any different imaging or process conditions than adjacent features. The alignment system, which detects the alignment markers is described further below.

The depicted apparatus could be used in a variety of modes. In a scan mode, the patterning device support (e.g., mask table) MT and the substrate table WT are scanned synchronously while a pattern imparted to the radiation beam is projected onto a target portion C (i.e., a single dynamic exposure). The speed and direction of the substrate table WT relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion. Other types of lithographic apparatus and modes of operation are possible, as is well-known in the art. For example, a step mode is known. In so-called "maskless" lithography, a programmable patterning device is held stationary but with a changing pattern, and the substrate table WT is moved or scanned.

Combinations and/or variations on the above described modes of use or entirely different modes of use may also be employed.

Lithographic apparatus LA is of a so-called dual stage type which has two substrate tables WTa, WTb and two stations—an exposure station EXP and a measurement station MEA—between which the substrate tables can be exchanged. While one substrate on one substrate table is being exposed at the exposure station, another substrate can be loaded onto the other substrate table at the measurement station and various preparatory steps carried out. This enables a substantial increase in the throughput of the apparatus. The preparatory steps may include mapping the surface height contours of the substrate using a level sensor LS and measuring the position of alignment markers on the substrate using an alignment sensor AS. If the position sensor IF is not capable of measuring the position of the substrate table while it is at the measurement station as well as at the exposure station, a second position sensor may be provided to enable the positions of the substrate table to be tracked at both stations, relative to reference frame RF. Other arrangements are known and usable instead of the dual-stage arrangement shown. For example, other lithographic apparatuses are known in which a substrate table and a measurement table are provided. These are docked together when performing preparatory measurements, and then undocked while the substrate table undergoes exposure.

Figure 2:
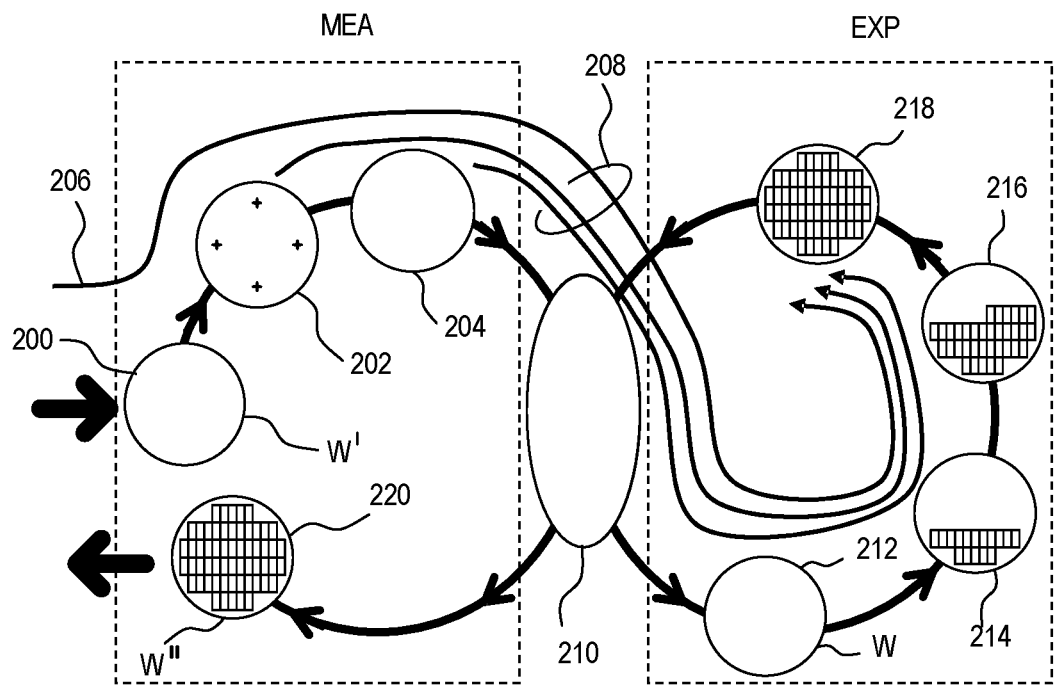
FIG. 2 illustrates schematically measurement and exposure processes in the apparatus of FIG. 1.

FIG. 2 illustrates the steps to expose target portions (e.g. dies) on a substrate W in the dual stage apparatus of FIG. 1. On the left hand side within a dotted box are steps performed at a measurement station MEA, while the right hand side shows steps performed at the exposure station EXP. From time to time, one of the substrate tables WTa, WTb will be at the exposure station, while the other is at the measurement station, as described above. For the purposes of this description, it is assumed that a substrate W has already been loaded into the exposure station. At step 200, a new substrate W' is loaded to the apparatus by a mechanism not shown. These two substrates are processed in parallel in order to increase the throughput of the lithographic apparatus.

Referring initially to the newly-loaded substrate W', this may be a previously unprocessed substrate, prepared with a new photo resist for first time exposure in the apparatus. In general, however, the lithography process described will be merely one step in a series of exposure and processing steps, so that substrate W' has been through this apparatus and/or other lithography apparatuses, several times already, and may have subsequent processes to undergo as well. Particularly for the problem of improving overlay performance, the task is to ensure that new patterns are applied in exactly the correct position on a substrate that has already been subjected to one or more cycles of patterning and processing. These processing steps progressively introduce distortions in the substrate that must be measured and corrected for, to achieve satisfactory overlay performance.

The previous and/or subsequent patterning step may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

At 202, alignment measurements using the substrate marks P1 etc. and image sensors (not shown) are used to measure and record alignment of the substrate relative to substrate table WTa/WTb. In addition, several alignment marks across the substrate W' will be measured using alignment sensor AS. These measurements are used in one embodiment to establish a "wafer grid", which maps very accurately the distribution of marks across the substrate, including any distortion relative to a nominal rectangular grid.

At step 204, a map of wafer height (Z) against X-Y position is measured also using the level sensor LS. Conventionally, the height map is used only to achieve accurate focusing of the exposed pattern. It may be used for other purposes in addition.

When substrate W' was loaded, recipe data 206 were received, defining the exposures to be performed, and also properties of the wafer and the patterns previously made and to be made upon it. To these recipe data are added the measurements of wafer position, wafer grid and height map that were made at 202, 204, so that a complete set of recipe and measurement data 208 can be passed to the exposure station EXP. The measurements of alignment data for example comprise X and Y positions of alignment targets formed in a fixed or nominally fixed relationship to the product patterns that are the product of the lithographic process. These alignment data, taken just before exposure, are used to generate an alignment model with parameters that fit the model to the data. These parameters and the alignment model will be used during the exposure operation to correct positions of patterns applied in the current lithographic step. The model in use interpolates positional deviations between the measured positions. A conventional alignment model might comprise four, five or six parameters, together defining translation, rotation and scaling of the 'ideal' grid, in different dimensions. Advanced models are known that use more parameters.

At 210, wafers W' and W' are swapped, so that the measured substrate W' becomes the substrate W entering the exposure station EXP. In the example apparatus of FIG. 1, this swapping is performed by exchanging the supports WTa and WTb within the apparatus, so that the substrates W, W' remain accurately clamped and positioned on those supports, to preserve relative alignment between the substrate tables and substrates themselves. Accordingly, once the tables have been swapped, determining the relative position between projection system PS and substrate table WTb (formerly WTa) is all that is necessary to make use of the measurement information 202, 204 for the substrate W (formerly W') in control of the exposure steps. At step 212, reticle alignment is performed using the mask alignment marks M1, M2. In steps 214, 216, 218, scanning motions and radiation pulses are applied at successive target locations across the substrate W, in order to complete the exposure of a number of patterns.

By using the alignment data and height map obtained at the measuring station in the performance of the exposure steps, these patterns are accurately aligned with respect to the desired locations, and, in particular, with respect to features previously laid down on the same substrate. The exposed substrate, now labeled W'' is unloaded from the apparatus at step 220, to undergo etching or other processes, in accordance with the exposed pattern.

The skilled person will know that the above description is a simplified overview of a number of very detailed steps involved in one example of a real manufacturing situation. For example rather than measuring alignment in a single pass, often there will be separate phases of coarse and fine measurement, using the same or different marks. The coarse and/or fine alignment measurement steps can be performed before or after the height measurement, or interleaved.

In the manufacture of complex devices, typically many lithographic patterning steps are performed, thereby forming functional features in successive layers on the substrate. A critical aspect of performance of the lithographic apparatus is therefore the ability to place the applied pattern correctly and accurately in relation to features laid down in previous layers (by the same apparatus or a different lithographic apparatus). For this purpose, the substrate is provided with one or more sets of marks. Each mark is a structure whose position can be measured at a later time using a position sensor, typically an optical position sensor. The position sensor may be referred to as "alignment sensor" and marks may be referred to as "alignment marks".

A lithographic apparatus may include one or more (e.g. a plurality of) alignment sensors by which positions of alignment marks provided on a substrate can be measured accurately. Alignment (or position) sensors may use optical phenomena such as diffraction and interference to obtain position information from alignment marks formed on the substrate. An example of an alignment sensor used in current lithographic apparatus is based on a self-referencing interferometer as described in U.S. Pat. No. 6,961,116. Various enhancements and modifications of the position sensor have been developed, for example as disclosed in US2015261097A1. The contents of all of these publications are incorporated herein by reference.

A mark, or alignment mark, may comprise a series of bars formed on or in a layer provided on the substrate or formed (directly) in the substrate. The bars may be regularly spaced and act as grating lines so that the mark can be regarded as a diffraction grating with a well-known spatial period (pitch). Depending on the orientation of these grating lines, a mark may be designed to allow measurement of a position along the X axis, or along the Y axis (which is oriented substantially perpendicular to the X axis). A mark comprising bars that are arranged at +45 degrees and/or −45 degrees with respect to both the X- and Y-axes allows for a combined X- and Y-measurement using techniques as described in US2009/195768A, which is incorporated by reference.

The alignment sensor may scan each mark optically with a spot of radiation to obtain a periodically varying signal, such as a sine wave. The phase of this signal is analyzed, to determine the position of the mark and, hence, of the substrate relative to the alignment sensor, which, in turn, is fixated relative to a reference frame of a lithographic apparatus. So-called coarse and fine marks may be provided, related to different (coarse and fine) mark dimensions, so that the alignment sensor can distinguish between different cycles of the periodic signal, as well as the exact position (phase) within a cycle. Marks of different pitches may also be used for this purpose.

Measuring the position of the marks may also provide information on a deformation of the substrate on which the marks are provided, for example in the form of a wafer grid. Deformation of the substrate may occur by, for example, electrostatic clamping of the substrate to the substrate table and/or heating of the substrate when the substrate is exposed to radiation.

Figure 3:
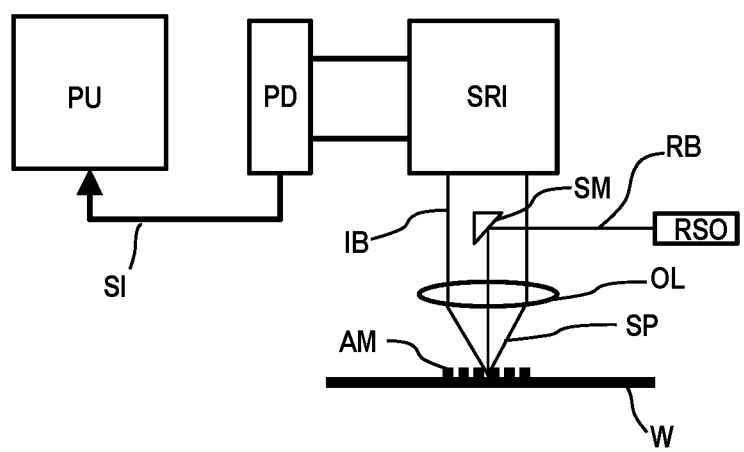
FIG. 3 is a schematic illustration of a first alignment sensor adaptable according to an embodiment.

FIG. 3 is a schematic block diagram of an embodiment of a known alignment sensor AS. Radiation source RSO provides a beam RB of radiation of one or more wavelengths, which is diverted by diverting optics onto a mark, such as mark AM located on substrate W, as an illumination spot SP. In this example the diverting optics comprises a spot mirror SM and an objective lens OL. The illumination spot SP, by which the mark AM is illuminated, may be slightly smaller in diameter than the width of the mark itself.

Radiation diffracted by the mark AM is collimated (in this example via the objective lens OL) into an information-carrying beam IB. The term "diffracted" is intended to include zero-order diffraction from the mark (which may be referred to as reflection). A self-referencing interferometer SRI, e.g. of the type disclosed in U.S. Pat. No. 6,961,116 mentioned above, interferes the beam IB with itself after which the beam is received by a photodetector PD. Additional optics (not shown) may be included to provide separate beams in case more than one wavelength is created by the radiation source RSO. The photodetector may be a single element, or it may comprise a number of pixels, if desired. The photodetector may comprise a sensor array.

The diverting optics, which in this example comprises the spot mirror SM, may also serve to block zero order radiation reflected from the mark, so that the information-carrying beam IB comprises only higher order diffracted radiation from the mark AM (this is not essential to the measurement, but improves signal to noise ratios).

Intensity signals SI are supplied to a processing unit PU. By a combination of optical processing in the block SRI and computational processing in the unit PU, values for X- and Y-position on the substrate relative to a reference frame are output.

A single measurement of the type illustrated only fixes the position of the mark within a certain range corresponding to one pitch of the mark. Coarser measurement techniques are used in conjunction with this to identify which period of a sine wave is the one containing the marked position. The same process at coarser and/or finer levels are repeated at different wavelengths for increased accuracy and/or for robust detection of the mark irrespective of the materials from which the mark is made, and materials on and/or below which the mark is provided.

Figure 4:
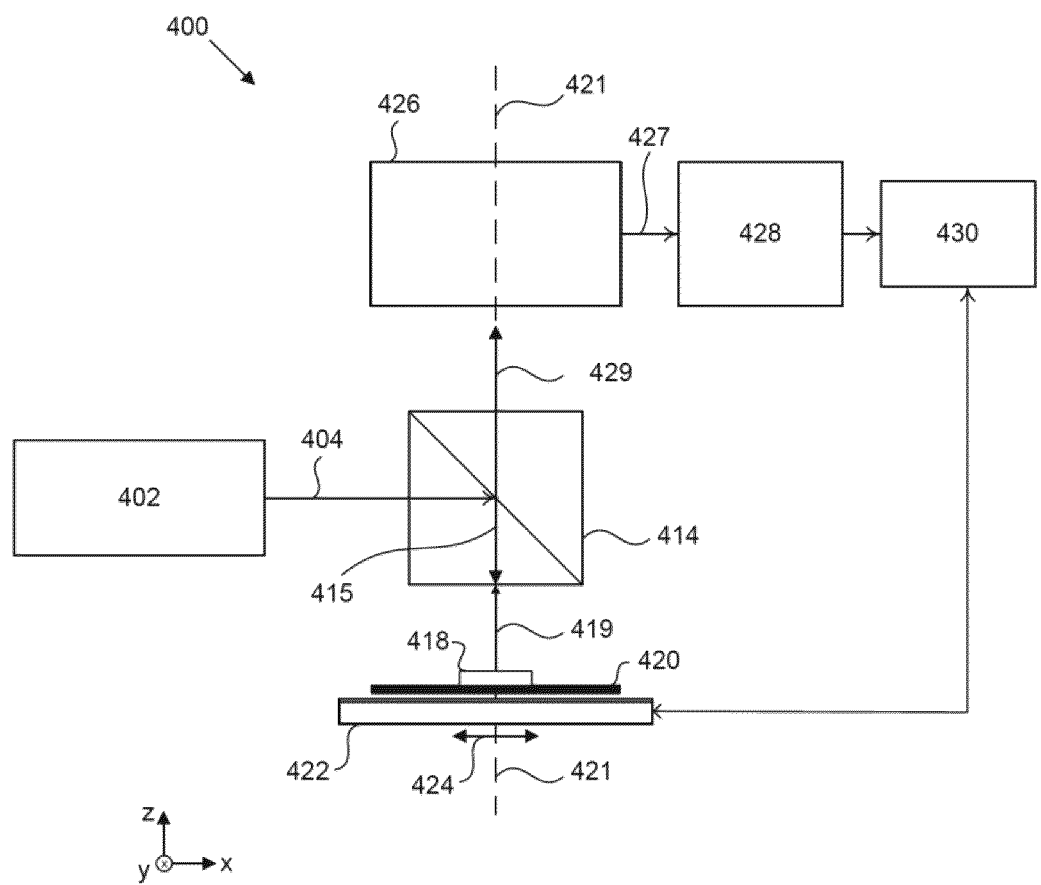
FIG. 4 is a schematic illustration of a second alignment sensor adaptable according to an embodiment.

FIG. 4 illustrates a schematic of a cross-sectional view of another known alignment apparatus 400. In an example of this embodiment, alignment apparatus 400 may be configured to align a substrate (e.g., substrate W) with respect to a patterning device (e.g., patterning device MA). Alignment apparatus 400 may be further configured to detect positions of alignment marks on the substrate and to align the substrate with respect to the patterning device or other components of lithographic apparatus 100 or 100' using the detected positions of the alignment marks. Such alignment of the substrate may ensure accurate exposure of one or more patterns on the substrate According to an embodiment, alignment apparatus 400 may include an illumination system 402, a beam splitter 414, an interferometer 426, a detector 428, and a signal analyzer 430, according to an example of this embodiment. Illumination system 402 may be configured to provide an electromagnetic narrow band radiation beam 404 having one or more passbands. In an example, the one or more passbands may be within a spectrum of wavelengths between about 400 nm to about 2.0 μm. In another example, the one or more passbands may be discrete narrow passbands within a spectrum of wavelengths between about 400 nm to about 2 μm.

Beam splitter 414 may be configured to receive radiation beam 404 and direct a radiation sub-beam 415 onto a substrate 420 placed on a stage 422. In one example, the stage 422 is movable along direction 424. Radiation sub-beam 415 may be configured to illuminate an alignment mark or a target 418 located on substrate 420. Alignment mark or target 418 may be coated with a radiation sensitive film in an example of this embodiment. In another example, alignment mark or target 418 may have one hundred and eighty degrees (i.e., 180°) symmetry. That is, when alignment mark or target 418 is rotated 180° about an axis of symmetry perpendicular to a plane of alignment mark or target 418, rotated alignment mark or target 418 may be substantially identical to an unrotated alignment mark or target 418. The target 418 on substrate 420 may be (a) a resist layer grating comprising bars that are formed of solid resist lines, or (b) a product layer grating, or (c) a composite grating stack in an overlay target structure comprising a resist grating overlaid or interleaved on a product layer grating. The bars may alternatively be etched into the substrate.

Beam splitter 414 may be further configured to receive diffraction radiation beam 419 and direct diffracted radiation sub-beam 429 towards interferometer 426, according to an embodiment In an example embodiment, diffracted radiation sub-beam 429 may be at least a portion of radiation sub-beam 415 that may be reflected from alignment mark or target 418. In an example of this embodiment, interferometer 426 comprises any appropriate set of optical-elements, for example, a combination of prisms that may be configured to form two images of alignment mark or target 418 based on the received diffracted radiation sub-beam 429. Interferometer 426 may be further configured to rotate one of the two images with respect to the other of the two images 180° and recombine the rotated and unrotated images interferometrically. In some embodiments, the interferometer 426 can be a self-referencing interferometer (SRI), which is disclosed in U.S. Pat. No. 6,628,406 (Kreuzer) and is incorporated by reference herein in its entirety.

In an embodiment, detector 428 may be configured to receive the recombined image via interferometer signal 427 and detect interference as a result of the recombined image when an alignment axis 421 of alignment apparatus 400 passes through a center of symmetry (not shown) of alignment mark or target 418. Such interference may be due to alignment mark or target 418 being 180° symmetrical, and the recombined image interfering constructively or destructively, according to an example embodiment. Based on the detected interference, detector 428 may be further configured to determine a position of the center of symmetry of alignment mark or target 418 and consequently, detect a position of substrate 420. According to an example, alignment axis 421 may be aligned with an optical beam perpendicular to substrate 420 and passing through a center of image rotation interferometer 426. Detector 428 may be further configured to estimate the positions of alignment mark or target 418 by implementing sensor characteristics and interacting with wafer mark process variations.

Another specific type of metrology sensor, which has both alignment and product/process monitoring metrology applications, has recently been recently described in European applications EP18195488.4 and EP19150245.9, which are incorporated herein by reference. This describes a metrology device with optimized coherence. More specifically, the metrology device is configured to produce a plurality of spatially incoherent beams of measurement illumination, each of said beams (or both beams of measurement pairs of said beams, each measurement pair corresponding to a measurement direction) having corresponding regions within their cross-section for which the phase relationship between the beams at these regions is known; i.e., there is mutual spatial coherence for the corresponding regions.

Such a metrology device is able to measure small pitch targets with acceptable (minimal) interference artifacts (speckle) and will also be operable in a dark-field mode. Such a metrology device may be used as a position or alignment sensor for measuring substrate position (e.g., measuring the position of a periodic structure or alignment mark with respect to a fixed reference position). However, the metrology device is also usable for measurement of overlay (e.g., measurement of relative position of periodic structures in different layers, or even the same layer in the case of stitching marks). The metrology device is also able to measure asymmetry in periodic structures, and therefore could be used to measure any parameter which is based on a target asymmetry measurement (e.g., overlay using diffraction based overlay (DBO) techniques or focus using diffraction based focus (DBF) techniques).

Figure 5:
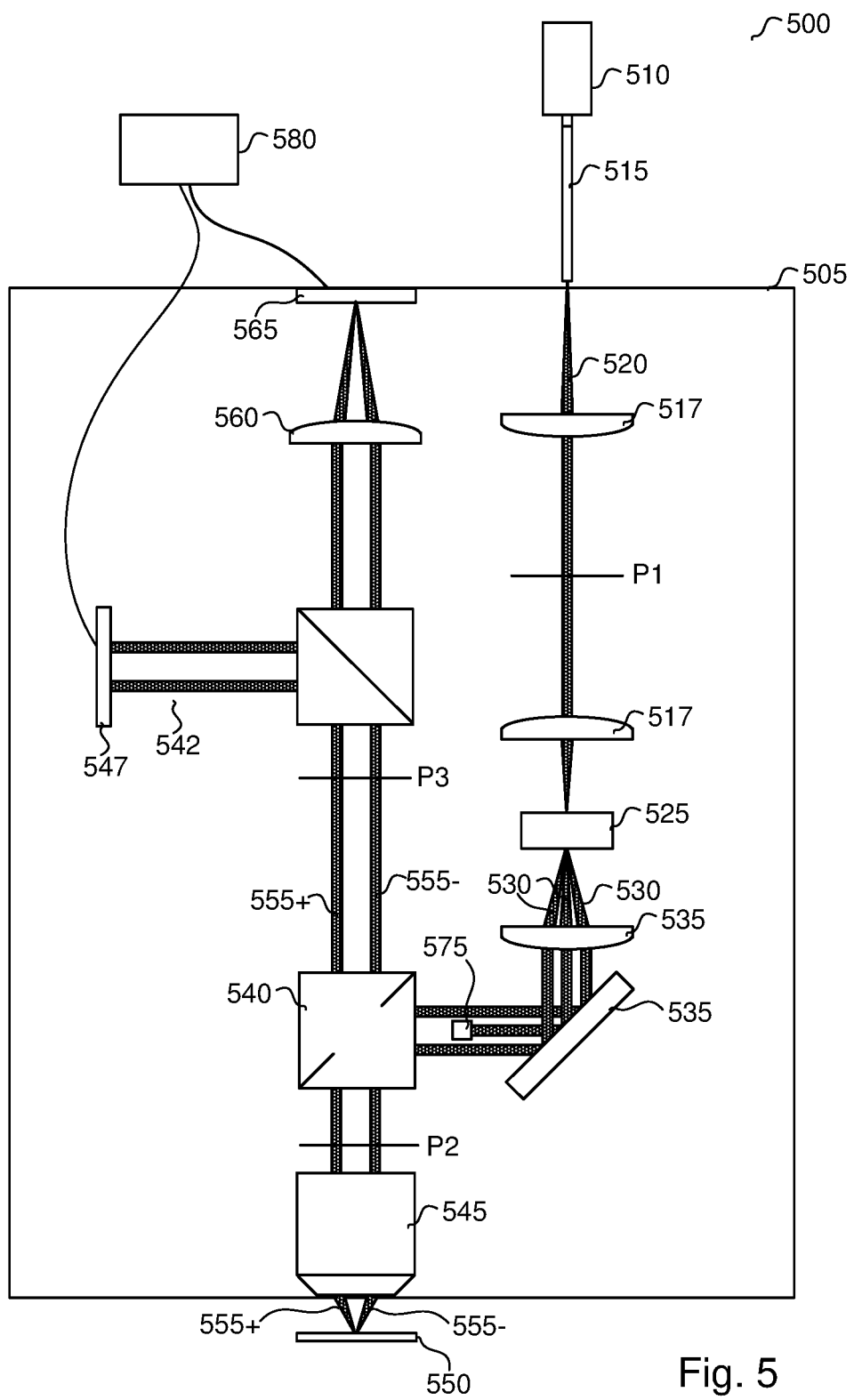
FIG. 5 is a schematic illustration of an alternative metrology device also usable for alignment and adaptable according to an embodiment.

FIG. 5 shows a possible implementation of such a metrology device. The metrology device essentially operates as a standard microscope with a novel illumination mode. The metrology device 500 comprises an optical module 505 comprising the main components of the device. An illumination source 510 (which may be located outside the module 505 and optically coupled thereto by a multimode fiber 515) provides a spatially incoherent radiation beam 520 to the optical module 505. Optical components 517 deliver the spatially incoherent radiation beam 520 to a coherent off-axis illumination generator 525. This component is of particular importance to the concepts herein and will be described in greater detail. The coherent off-axis illumination generator 525 generates a plurality (e.g., four) off-axis beams 530 from the spatially incoherent radiation beam 520. The characteristics of these off-axis beams 530 will be described in detail further below. The zeroth order of the illumination generator may be blocked by an illumination zero order block element 575. This zeroth order will only be present for some of the coherent off-axis illumination generator examples described in this document (e.g., phase grating based illumination generators), and therefore may be omitted when such zeroth order illumination is not generated. The off-axis beams 530 are delivered (via optical components 535 and) a spot mirror 540 to an (e.g., high NA) objective lens 545. The objective lens focusses the off-axis beams 530 onto a sample (e.g., periodic structure/alignment mark) located on a substrate 550, where they scatter and diffract. The scattered higher diffraction orders 555+, 555− (e.g., +1 and −1 orders respectively), propagate back via the spot mirror 540, and are focused by optical component 560 onto a sensor or camera 565 where they interfere to form an interference pattern. A processor 580 running suitable software can then process the image(s) of the interference pattern captured by camera 565.

The zeroth order diffracted (specularly reflected) radiation is blocked at a suitable location in the detection branch; e.g., by the spot mirror 540 and/or a separate detection zero-order block element. It should be noted that there is a zeroth order reflection for each of the off-axis illumination beams, i.e. in the current embodiment there are four of these zeroth order reflections in total. As such, the metrology device operated as a "dark field" metrology device.

In one embodiment, the metrology device may also comprise a pupil imaging branch 542, with corresponding pupil camera 547. There are a number of reasons why pupil imaging may be desirable. By way of a single example, the illumination spot size on the substrate might be tunable. One application of such a tunable illumination spot size is to better implement a pupil metrology mode, as such a mode may benefit from having the illumination spot underfilling the target (to avoid unwanted scattering in overlapping pupil coordinates).

In an embodiment, a coherence scrambler may be provided such that the incoherent beams may actually be pseudo-spatially incoherent, e.g., generated from a coherent illumination source such as a laser, while undergoing one or more processes to mimic spatial incoherence. This may comprise making the coherent radiation multimode and ensemble averaging different realizations during the integration time of the detector. More specifically, in an embodiment, many (e.g., random) realizations of speckle patterns (which are spatially coherent patterns) are generated with, e.g., a laser and a multimode fiber and/or a rotating diffuser plate. An ensemble average over these random speckle pattern realizations is determined which averages out interference effects and therefore effectively mimics spatial incoherence (the interference is averaged out on the detector plane during its integration time).

A main concept of this metrology device is to induce spatial coherence in the measurement illumination only where required. More specifically, spatial coherence is induced between corresponding sets of pupil points in each of the off-axis beams 530. More specifically, a set of pupil points comprises a corresponding single pupil point in each of the off-axis beams, the set of pupil points being mutually spatially coherent, but where each pupil point is incoherent with respect to all other pupil points in the same beam. By optimizing the coherence of the measurement illumination in this manner, it becomes feasible to perform dark-field off-axis illumination on small pitch targets, but with minimal speckle artifacts as each off-axis beam 530 is spatially incoherent.

Figure 6:
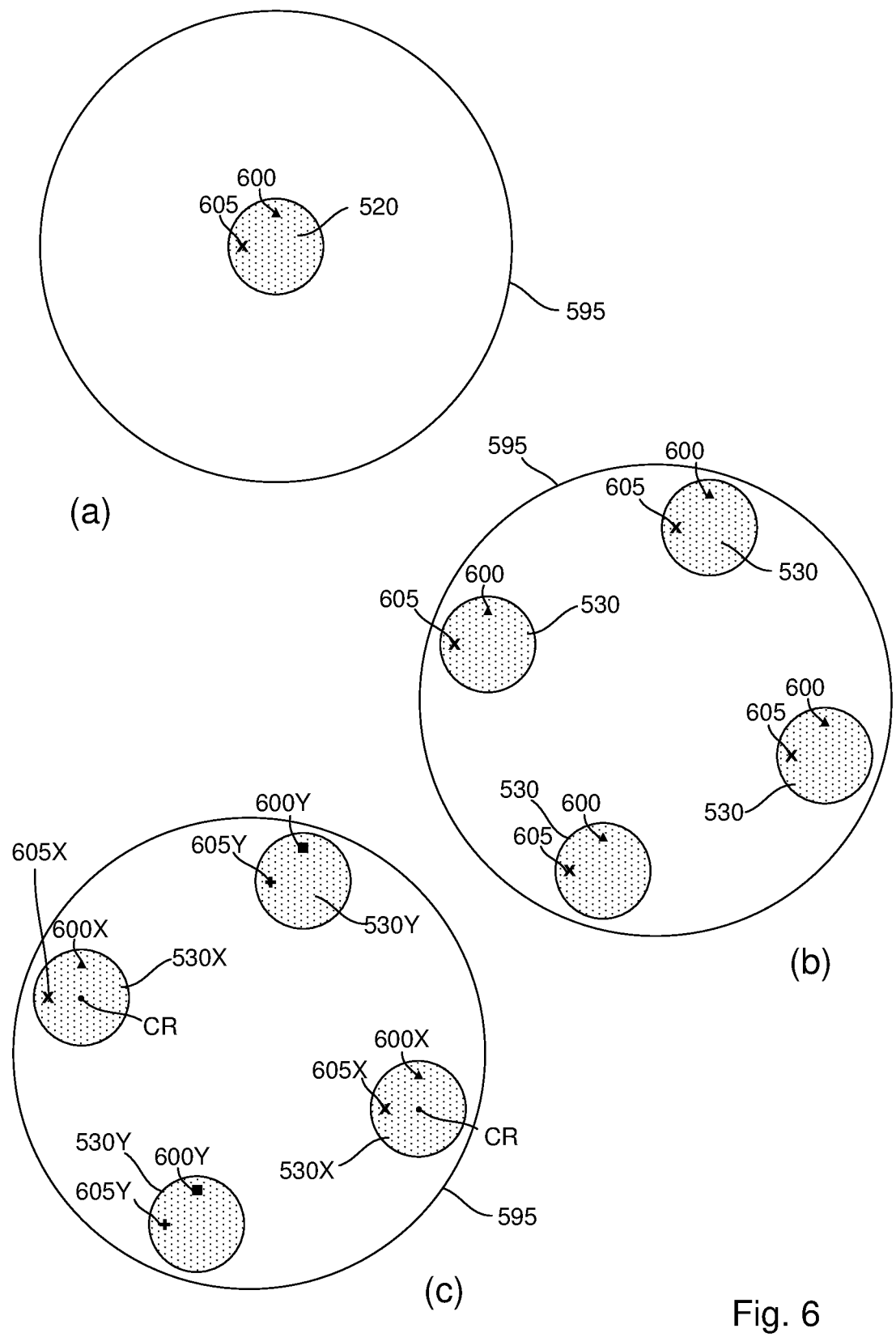
FIG. 6 comprises (a) a pupil image of input radiation (b) pupil image of off-axis illumination beams illustrating an operational principle of the metrology device of FIG. 5; and (c) pupil image of off-axis illumination beams illustrating another operational principle of the metrology device of FIG. 5.

FIG. 6 shows three pupil images to illustrate the concept. FIG. 6(a) shows a first pupil image which relates to pupil plane P1 in FIG. 5, and FIGS. 6(b) and 6(c) each show a second pupil image which relates to pupil plane P2 in FIG. 5. FIG. 6(a) shows (in cross-section) the spatially incoherent radiation beam 520, and FIGS. 6(b) and 6(c) show (in cross-section) the off-axis beams 530 generated by coherent off-axis illumination generator 525 in two different embodiments. In each case, the extent of the outer circle 595 corresponds to the maximum detection NA of the microscope objective; this may be, purely by way of an example 0.95 NA.

The triangles 600 in each of the pupils indicate a set of pupil points that are spatially coherent with respect to each other. Similarly, the crosses 605 indicate another set of pupil points which are spatially coherent with respect to each other. The triangles are spatially incoherent with respect to crosses and all other pupil points corresponding to beam propagation. The general principle (in the example shown in FIG. 6(b)) is that each set of pupil points which are mutually spatially coherent (each coherent set of points) have identical spacings within the illumination pupil P2 as all other coherent sets of points. As such, in this embodiment, each coherent sets of points is a translation within the pupil of all other coherent sets of points.

In FIG. 6(b), the spacing between each pupil point of the first coherent set of points represented by triangles 600 must be equal to the spacing between each pupil point of the coherent set of points represented by crosses 605. 'Spacing' in this context is directional, i.e., the set of crosses (second set of points) is not allowed to be rotated with respect to the set of triangles (first set of points). As such, each of the off-axis beams 530 comprises by itself incoherent radiation; however the off-axis beams 530 together comprise identical beams having corresponding sets of points within their cross-section that have a known phase relationship (spatial coherence). It should be noted that it is not necessary for the points of each set of points to be equally spaced (e.g., the spacing between the four triangles 605 in this example is not required to be equal). As such, the off-axis beams 530 do not have to be arranged symmetrically within the pupil.

FIG. 6(c) shows that this basic concept can be extended to providing for a mutual spatial coherence between only the beams corresponding to a single measurement direction where beams 530X correspond to a first direction (X-direction) and beams 530Y correspond to a second direction (Y-direction). In this example, the squares and plus signs each indicate a set of pupil points which correspond to, but are not necessarily spatially coherent with, the sets of pupil points represented by the triangles and crosses. However, the crosses are mutually spatially coherent, as are the plus signs, and the crosses are a geometric translation in the pupil of the plus signs. As such, in FIG. 6(c), the off-axis beams are only pair-wise coherent.

In this embodiment, the off-axis beams are considered separately by direction, e.g., X direction 530X and Y direction 530Y. The pair of beams 530X which generate the captured X direction diffraction orders need only be coherent with one another (such that pair of points 600X are mutually coherent, as are pair of points 605X). Similarly the pair of beams 530Y which generate the captured Y direction diffraction orders need only be coherent with one another (such that pair of points 600Y are mutually coherent, as are pair of points 605Y). However, there does not need to be coherence between the pairs of points 600X and 600Y, nor between the pairs of points 605X and 605Y. As such there are pairs of coherent points comprised in the pairs of off-axis beams corresponding to each considered measurement direction. As before, for each pair of beams corresponding to a measurement direction, each pair of coherent points is a geometric translation within the pupil of all the other coherent pairs of points.

Alignment sensors such as those illustrated in FIG. 3, 4 or 5, for example, measure the position of an alignment target on a substrate or wafer, by detecting and observing the interference pattern of the diffracted orders diffracted by a grating. Since the light coming from different diffracted orders follows different optical paths in the sensor, a phase difference between orders arises due to the light probing different optical aberrations of the optical system. The effect of this phase difference is a deviation of the detected aligned position from the "true" physical position of the target. The constant term of this variation (both intra-wafer and wafer-to-wafer) can be calibrated out with existing calibration procedures. Problems arise, however, when there is a variation in the intensity of the diffracted light as a function of the diffracted angle. Common causes for this variation are process-induced effects (such as stack thickness variation), which result in a variation of the angular reflectivity of the grating. Such variation results in a variation of the light intensity distribution at the pupil plane or Fourier plane of the objective lens of the system.

The intensity variation within the pupil results in a variation of the aligned position deviation. This variation represents a source of alignment accuracy error which is not correctable with the current calibration procedures.

To address this issue, a data-driven approach for error correction is proposed, which is able to better correct such process and/or stack dependent aligned position deviation. In some optional embodiments, it is proposed to use coherence properties and the symmetry of the sensor in determining the correction; two specific such embodiments will be explicitly described, a first relating to a self-referencing interferometer based alignment sensor such as illustrated in FIGS. 3 and 4 and the second relating to an optimized coherence alignment sensor such as illustrated by FIGS. 5 and 6.

The proposal disclosed herein comprises developing a fully scalable correction platform which can be extended to higher orders in the pupil intensity variations. Errors due to a complex redistribution of the intensity within the pupil or any possible inaccuracy in the knowledge of the optical aberrations of the sensor may be overcome by the proposed data-driven approach where a model is trained based on pupil images acquired under the same conditions as the target measurements.

Figure 7:
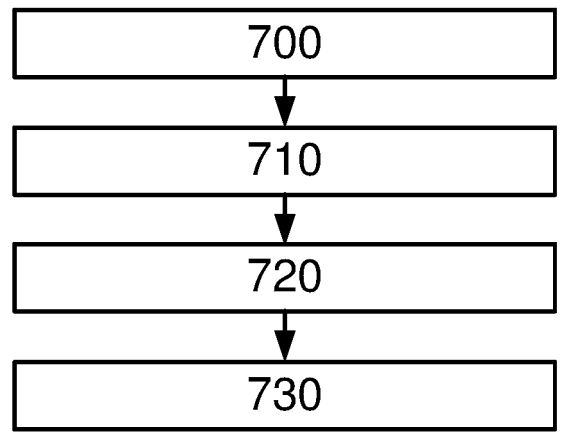
FIG. 7 is a flowchart describing a method according to an embodiment.

FIG. 7 is a flowchart of a method according to an embodiment. The method will be described in more detail below, but briefly the steps are:

700—perform a calibration to determine a sensor term for the optical system, the sensor term being defined for each scattering angle (i.e., for each position in the pupil plane) within an angle range comparable with the angular spread of light propagating through the sensor.

710—perform an alignment measurement while obtaining a pupil plane measurement dataset; e.g., an image of the pupil plane comprising a measured intensity distribution of radiation scattered (i.e., diffracted and/or specularly reflected) from an alignment mark or other structure;

720—optionally processing the intensity distribution to obtain a processed intensity distribution or intensity term from the pupil plane image, the intensity term being defined for each scattering angle (i.e., comprising a processed intensity distribution over each position in the pupil plane) within a given angular range, determined by the angular spread of light propagating through the system;

730—determining a correction for the aligned position by application of a model, such as a linear regression model, using the intensity term and sensor term.

Step 710 comprises obtaining an image of the pupil plane of the objective (light scattered from the target as a function of angular coordinates). This image can be obtained using an external device or an internal branch of the sensor if the sensor is so equipped. For example, such a pupil imaging branch is illustrated in FIG. 5 (pupil imaging branch 542, with corresponding pupil camera 547).

It is proposed (e.g., in step 720) to extract a specific intensity related feature from the camera images of the pupil plane. This feature is referred to as the intensity term, $I_i$, because it is a function of the intensity of the pupil images. The intensity term is a set of scalar numbers, defined individually for pixels (e.g., every pixel) or locations within the diffracted spots in the pupil plane (and therefore for each individual scattering angle of the diffracted radiation). The index i labels these locations (or pixels). The details of the intensity term are described below.

In step 730, a linear regression model may be assumed in an embodiment, e.g., that describes the correction δ for an aligned position as given by the dot product of the intensity term $I_i$ with a sensor model or sensor term $\phi_i$:

$$\delta = \sum_i I_i \cdot \phi_i \qquad (1)$$

The sensor term Op may be calibrated (e.g., in step 700) from a training set of data using a supervised learning approach. The details of the calibration procedure will be described below.

In other embodiments a non-linear model is assumed in step 730.

There are a number of alternative approaches for defining the intensity term. A first example for the intensity term $I_i$ comprises using the normalized intensity of each pixel of a higher (i.e., not zeroth) diffraction order; e.g., in either of the +1 and the −1 diffracted order spots or any other higher order diffraction spot(s); e.g., +2, −2 orders in the case where other higher-order diffraction is captured in the pupil. Alternatively, or in combination, (e.g., normalized) zeroth order scattered radiation may be used.

By way of a specific example, and with reference to FIG. 6(c), the intensity term may include the intensity distribution of the pupil points inside one of the two spots marked as 530X, or (as an alternative example) one of the two spots marked as 530Y, or any other diffracted or scattered (e.g., specularly reflected) spot that is captured in the pupil. The intensity term computed from spot 530X may include, as an example, the intensities at pupil points 600X and 605X and any other pupil point inside the spot, each intensity being normalized to the total intensity integrated inside the spot.

As such, for example, the intensity term $I_i$ may be defined as:

$$I_i = I_i^{(+1)} / \sum_n I_n^{(+1)} \qquad (2)$$

where $I_i^{(+1)}$ is the intensity for the ith pixel (of n pixels total) of the +1 diffraction order (although this could equally be the −1 order or any other higher diffraction order, or the zeroth order).

In such an embodiment, a single diffraction spot can be used. Alternatively, a correction can be determined for both spots (+1 and −1 order) separately and the results of these corrections averaged. As such, a correction δ may be determined from each of the diffraction spots based on a separate consideration of each spot effectively as if they were separate images (e.g., using Equation (1) for each spot separately and averaging the results). This averaging can help average out any processing or alignment mark asymmetry.

In a second embodiment, the intensity of a pixel at position $+r_i$ in the +1 diffracted spot is averaged (using any kind of average: e.g., linear, RMS) with the intensity of the pixel at a corresponding position $-r_i$ in the −1 diffracted spot. This method is more robust against effects such as tilts and grating asymmetry. A corresponding position may comprise a symmetrically opposite position in the pupil with respect to an axis of symmetry within the pupil (the pupil images will be nominally symmetrical, although in reality asymmetry may be observed due to mark asymmetry etc.).

In a further embodiment, the sensor symmetry can be explicitly taken into account and used in determining an intensity feature. In this context, sensor symmetry can be understood as describing the relationship that governs which pairs of pixels interfere to generate the fringe pattern. From the sensor design, such pairs of coherent pixels can be identified in the pupil plane. The actual equations for identifying the interfering pairs depend on the type of sensor.

For an embodiment of an alignment sensor, including but not limited to an SRI based alignment sensor as illustrated in FIG. 3 or 4 (or an off-axis illumination equivalent), the intensity metric may comprise a more specific example of the previous embodiment, using a geometric mean. More specifically the intensity metric of such an embodiment may take the form:

$$I_i = \sqrt{I^{(+1)}(+r_i) \cdot I^{(-1)}(-r_i)} / \left[ \sum_n \sqrt{I^{(+1)}(+r_n) \cdot I^{(-1)}(r_n)} \right] \qquad (3)$$

where $I^{(+1)}(+r_i)$ is the intensity at location $+r_i$ in the +1 diffracted spot and $I^{(-1)}(-r_i)$ is the intensity at location $-r_i$ in the −1 diffracted spot. The location $-r_i$ may comprise a symmetrically opposite position to that of location $+r_i$ in the pupil with respect to an axis of symmetry within the pupil. A similar intensity term may be defined for any pair of opposite diffracted order spots (−2, +2) which are captured in the pupil.

For a sensor such as illustrated in FIGS. 5 and 6, the points which mutually interfere are those at the same relative position with respect to the position of the chief rays $r^{(+1)}$ and $r^{(-1)}$. This can be appreciated by reference to FIG. 6(c). The chief rays can be identified from the specific sensor optics; for example (considering only X direction for now) the chief rays CR may be located at the respective centers of off-axis beams 530X. Each pair of coherent pixels are those in the same position within its respective spot 530X with respect to the spot center; e.g., the two pixels labeled 600X comprise one such coherent pair, as do the two pixels labeled 605X. The same analysis may be made for the Y direction.

More specifically, for such an embodiment, the intensity term may be defined as:

$$I_i = \sqrt{I^{(+1)}(r^{(+1)} + r_i) \cdot I^{(-1)}(r^{(-1)} + r_i)} / \left[ \sum_n \sqrt{I^{(+1)}(r^{(+1)} + r_n) \cdot I^{(-1)}(r^{(-1)} + r_n)} \right] \qquad (4)$$

where $I^{(+1)}(r^{(+1)}+r_i)$ and $I^{(-1)}(r^{(-1)}+r_i)$ describe the intensities of such a pair of coherent pixels (i.e., $I^{(+1)}(r^{(+1)}+r_i)$ is the intensity of a pixel displaced by $+r_i$ with respect to chief ray $r^{(+1)}$ in the +1 diffraction order and $I^{(-1)}(r^{(-1)}+r_i)$ is the intensity of a pixel displaced by $+r_i$ with respect to chief ray $r^{(-1)}$ in the −1 diffraction order.

Figure 8:
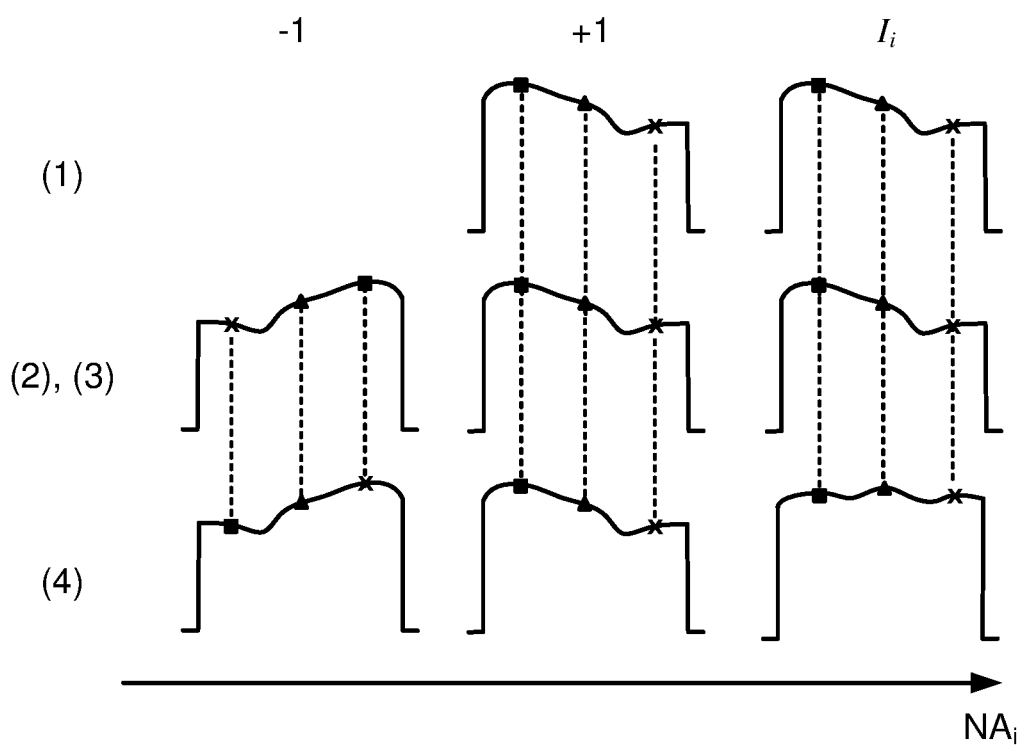
FIG. 8 comprise pupil intensity plots as a function of pupil location, conceptually illustrating the intensity metrics of different embodiments.

FIG. 8 conceptually illustrates each of the above examples. Each plot is a simplified 1D intensity plot across a pupil (with pupil coordinates $NA_i$ in one dimension across a linear axis passing through the center of symmetry of the pupil). In each case, the first column corresponds to the −1 diffraction order, the second column corresponds to the +1 diffraction order and the third column corresponds to the resultant intensity term $I_i$. The first row describes an embodiment using Equation (1), based on only the +1 diffraction order. Three specific pupil coordinates $N_A$ are signified by the square, triangle and cross in each column. The second row describes an embodiment using Equation (2) or (3), averaged per pair of symmetrically opposite pixels. As such the pixel represented by the square, triangle and cross in −1 order column will be averaged with the corresponding pixel in the second +1 order column. Therefore each pixel in the intensity metric column is essentially at the same level as each of its corresponding pixels in the −1 order and +1 order column (assuming a largely symmetrical pupil). The third row describes an embodiment using Equation 4. Note here that the corresponding pixels are no longer symmetrical in the pupil (around an axis of symmetry dividing the −1 order column and +1 order column). Instead the "cross" pixel is to the right of the "triangle" pixel (the latter corresponding to the chief ray) for both +1 and −1 orders, and similarly the "square" pixel is to the left of the "triangle" pixel for both orders (reference can be made again to FIG. 6 to visualize why this is so). Again, the result of averaging the corresponding pairs of pixels is the intensity metric shown in the third row.

In all the above examples, the concepts are extendable to higher diffraction orders than the first order diffraction and any reference to +1 and/or −1 diffraction orders can be taken to refer to any higher diffraction order(s). Also, while equations (2), (3) and (4) all describe a normalized intensity metric, this normalization is not strictly necessary.

In an embodiment, a pupil measurement performed at a first wavelength may be used to correct an aligned position measurement performed at a second wavelength. More specifically, step 710 may comprise taking N measurements for N colors, where each measurement comprises an image plane image (e.g., diffraction fringe image) and pupil image for each color, and using all the N pupil images measured at different colors to correct all the N measured positions for the different colors. In a similar manner, Y direction diffraction orders in the pupil can be used to correct X direction positions and vice versa; and/or pupils measured at a first polarization state can be used to correct positions measured at a second polarization state.

The calibration step 700 may be performed using a supervised, semi-supervised or unsupervised learning approach based on a plurality of calibration pupil datasets (e.g., a plurality of calibration pupil images). These pupil images should be diverse (e.g., have differences in the pupil plane intensity) which are comparable with the actual pupil images recorded by the pupil camera on product targets.

Any suitable method for obtaining such diverse pupil datasets or pupil images may be used and the specifics of such a method is not important. By way of example, a non-exhaustive list of embodiments for obtaining the calibration images may comprise (one or any combination of two or more of):

a) Measuring a set of training and/or product wafers having process-induced variations. This may be as part of a 'recipe setup' phase or in a 'shadow mode', i.e., measure while running production and continuously check whether the pupil metrology model parameters could be improved.

b) Measuring a set of wafers that have been specifically fabricated having controlled and/or uncontrolled stack thickness variation.

c) Measuring a set of targets on the same wafer having controlled and/or uncontrolled intra-wafer process variation.

d) Using a rotating/moving aperture to filter/modify the angular intensity of the illumination light, and/or to filter/modify the light intensity in any plane conjugate to the objective pupil plane.

e) Using a spatial light modulator or a similar device for the same purpose as embodiment d).

f) Modulating the light source intensity in synchronization with a scanning mechanism for the same purposes as embodiment d). This can be done, for example, by using a coherence scrambler (such as may be comprised in the device illustrated in FIG. 5) and modulating the intensity of the laser in synchronization with the scan mirror.

g) Using a coherence scrambler to generate a set speckle patterns in the illumination intensity. This can be done by keeping the scan mirror still so as to focus light on a fixed position on the fiber core. This will generate a speckle pattern at the other end of the fiber, which will be imaged on the pupil plane. A different position of the input fiber facet will result in a different speckle pattern.

h) measuring a mark (e.g., a fiducial mark) using a range of colors. The light will go through a slightly different part of the pupil for each color. This will result in a different measured position as function of color, and therefore as function of position in the pupil. This information can be used for pupil metrology.

i) Measuring a set of targets with controlled design differences (e.g., different duty cycle, subsegmentation) to induce different angular diffraction profiles.

j) Measuring a set of gratings having different orientations and pitches, in a manner such that the corresponding spots in the pupil will overlap in a region of interest. In this way, for every pixel in this region of the pupil there will be multiple measurements. For some of these measurements, the pixel intensity will be zero, for some others, it will be some non-zero value. This will provide enough variation in the pupil intensities for the calibration.

k) Using an external device which is located at a location on the wafer or fiducial which enables modification of the angular diffraction intensity of a grating in a controlled manner.

l) If wafers have a process variation over the wafer, e.g., a layer thickness variation gradient from center to edge of wafer, and if the layer thickness also changes (over the whole wafer uniformly) between wafers, it becomes possible to determine whether pupil metrology is well calibrated. If pupil metrology is not well calibrated, rings will appear in the measured alignment grids, these rings will disappear if well calibrated.

m) while doing recipe setup for a new process layer, using the calibration map determined for a previous (preferably similar) process layer as a starting point/initial guess, and then improve on this using any of the other methods described in this paragraph.

n) estimating (e.g., an initial guess) an aberration map based on previously built and calibrated sensors, possibly updated by taking into account a measured aberration map for the new sensor.

o) Measuring a set of training wafers, each wafer comprising a specific calibration (e.g., alignment) mark structure of interest, and one or more additional calibration reference (e.g., alignment) marks, e.g., having different properties.

As a supervised approach is proposed in some embodiments, each calibration image may have a corresponding "ground truth"; i.e., the actual or known correction for the aligned position should be known. How this ground truth correction is obtained largely depends on the way in which images have been collected. For embodiments a), b), c), i), j), o) the actual correction can be obtained by exposing the alignment mark and measuring the resultant overlay; e.g., using a metrology apparatus (e.g., a scatterometry based metrology apparatus such as typically used for overlay metrology). For embodiments d), e), f), g), k) the ground truth is automatically given, as with these examples the same targets are being imaged at the same position. For embodiments c), i), and j) the accuracy in the nominal position of the targets on the wafer might be enough to provide a ground truth. Embodiments h) and l) do not require any ground truth. These are intended to be non-exhaustive examples. Any technique in use, in development, or to be developed, which can quantify the aligned position variation can be used to obtain the ground truths.

In an embodiment, applicable where the alignment sensor also images the diffracted radiation to obtain a field image (i.e., a wafer image or image plane data from the scattered radiation), it is proposed that this image plane data is used in combination with the pupil plane image methods disclosed above in this calibration step. For example the optimized coherence alignment sensor such as illustrated by FIGS. 5 and 6, also images the scattered radiation at the image plane, although the concepts are equally applicable to any metrology device or alignment sensor which obtains images of the scattered radiation at both the pupil plane and image plane. Note that the image plane data is not necessarily an image in the true sense (the optimized coherence alignment sensor, for example, is a darkfield sensor and therefore the zeroth order is typically not imaged, but blocked). Here the image plane data may be obtained from a field image of an interference pattern formed by complementary diffraction orders (e.g., +1 and −1 order) of the scattered radiation at an image plane.

This combined information provides more robustness than using the information in the pupil plane alone. As an example, the presence of a strong product crosstalk signal is more apparent and more easily observable from the field image, and therefore any corresponding pupil image change can be correlated (with high confidence) with this product crosstalk, rather than a layer/stack thickness variation. Therefore it is possible, for example, to separate the pupil response variation due to layer thickness and pupil response variation due to crosstalk effects in the regression analysis, improving the fit of the resultant model so that it is fit to relevant pupil data. Such a method may comprise calibrating the model to be robust for layer thickness, while ignoring pupil effects which correlate with crosstalk effects.

The addition of wafer image data is especially relevant for small marks, where finite mark effects and product crosstalk within the illumination area can have a strong impact on the pupil image. Where the pupil image is being used to correct process information, this correction will suffer when light from surrounding structures also ends up in the pupil.

As with all the regression-based methods described, a successful implementation requires that there be representative variations in the input signal present in the training data (e.g., variations likely affect crosstalk). As such, the proposed methods may comprise an intermediate step of derive the pitch(es) of surrounding structures (using any suitable metrology technique, for example, or using the values for the expected pitches) and using these in the ground truth data for the correction. Such a concept can be applied, for example, to any of the calibration examples described based on measurement of calibration wafers (e.g., training or product wafers), where these calibration wafers also have variation which will affect crosstalk effects (e.g., such as surrounding structure parameter variation/location/ distance to target etc.). The regression can then learn the correlations between surrounding product variation (crosstalk contributor variation) and its effects on field image and pupil image. In particular, the regression analysis may aim to distinguish crosstalk effects from other processing (e.g., layer/stack thickness) effects in the pupil image data based on the field image data.

This may be achieved by extending the model described in Equation (1) above. In that form, it determines a correction by multiplying pupil image observables (e.g. measured pupil intensity distribution) with a sensor model (sensor term). It is proposed in this embodiment to include an additional term comprising the product of wafer image observables and sensor model: e.g.:

$$\delta = \sum_i I_i \cdot \phi_i + \sum_j J_j \cdot \phi_j \quad (5)$$

where $J_j$ is the wafer image measurement data or wafer image observables. This can then be inverted to optimize the sensor term $\phi_i$ in terms of correcting said calibration pupil plane images $I_i$ e.g., for layer/stack thickness variation.

The wafer image observables or datasets may be intensities. However, better performance may be achieved using e.g., local fringe amplitude (and/or fringe phase) at the surrounding structure:

In an embodiment, more of each pupil image (e.g., parts of the pupil image relating to crosstalk effects) may also be used in the regression analysis. By way of a specific example, if the surrounding structure has a slightly different pitch to that of the alignment mark pitch such that the diffraction orders from the product pitch partially (but not completely) overlap with the mark pitch, this will be seen in the pupil image, and can also used in the correction. The description above has largely described using the part of the pupil where the diffraction orders of the mark are located. In general, other areas within the pupil may also comprise information which correlates with alignment error. The basic idea in this embodiment is to exploit this additional information. Such a method may comprise expanding the pupil image observables ($I_i$) and the sensor term ($\phi_i$) of Equation (1) or (5) to cover the entire pupil image or a larger portion thereof, instead of only the part where the +1 and −1 diffraction orders of the mark are expected to be. Note that this can be done independently of or in combination with the crosstalk correction just described.

As an optional step, the dimensionality of the problem can be reduced by projecting the intensity term on a suitable basis, for example Zernike polynomials. In this way, all vectors are reduced from the size of the image pixels to the size of the chosen basis. The basis can be optimized so that the dimensionality is reduced as much as possible, e.g., using a principal component analysis method or other suitable method.

Formally, this means the intensity term $\tilde{I}_m$ becomes:

$$\tilde{I}_m = \sum_i I_i Z_i^{(m)} \quad (6)$$

where $Z_i^{(m)}$ is the value of the mth element of the basis (e.g., Zernike polynomials) at pixel i. In this case, Equation (1) becomes:

$$\delta = \sum_m \tilde{I}_m \cdot \phi_m \quad (7)$$

This embodiment can be adapted simply to run over both the pupil and the wafer plane images where wafer plane data is used (e.g., to remove crosstalk effects); for example, by treating Equation (5) in an equivalent manner.

The linear problem in Equation (1), (5) or (7) may be inverted to calibrate the sensor term $\phi_i$ or $\phi_m$ from the intensity term of each calibration image and the corresponding "ground truth" S. In a possible embodiment, this inversion may be realized using a least-square fit. Any other linear fitting algorithm could also be used.

Once the calibrated sensor term $\phi_i$ or $\phi_m$ is fitted from the calibration data, it can be used to compute the correction for any subsequent image, using Equation (1) or (6).

Embodiment o) comprises an approach which can be used independently or as a refinement to one or more of the other embodiments. In particular, Embodiment o) can be used to determine a set of training wafers for the training regression to calibrate the sensor term. The training wafers may comprise representative variations as would be expected in high volume manufacturing (HVM), optimized for a specific alignment mark structure of interest (e.g., having the same structure as will be used on the actual product wafers).

Embodiment o) may comprise measuring a set of training wafers, each wafer comprising a desired alignment mark structure of interest, and one or more additional reference alignment marks. The reference alignment marks should have a known mark sensitivity (e.g., this may be determined from earlier calibrations and/or modeling using for example any of the other embodiments a) to m) as appropriate), and a sensitivity to factors such as layer thickness which is either known and/or for which the reference mark is relatively insensitive.

In this embodiment, the aligned position of the desired training alignment mark can be referenced to the position of the reference alignment mark(s). This may comprise determining (measuring) aligned position offsets between the respective aligned positions of the alignment mark structure of interest and the reference alignment mark(s) which correspond to the pupil images of the alignment mark structure of interest.

The reference alignment marks (where more than one is provided) may differ in properties which may include, for example one or more of: subsegmentation, duty cycle, line width and/or pitch. Subsegmentation in this context may describe the segmenting of the lines of the gratings. The subsegmentation of a line may be substantially in the same direction as the grating it segments (e.g., each line of an X direction grating may be segmented in the X direction and each line of a Y direction grating may be segmented in the Y direction) and/or the subsegmentation may be in the opposite direction as the grating it segments.

In some embodiments, the training wafers may comprise the same layers as would be included in the recipe data which is to be used during the exposure process (e.g., the training wafers may comprise the same layers as will be used in a process of interest such as a particular production process). The training wafers may also comprise pre-defined substrates, for exposure at a fabrication facility.

It is described above that the reference mark(s) may comprise one or more properties such that it is relatively insensitive to layer thickness variation. This may comprise providing reference marks with subsegmentation which is robust (i.e., less sensitive) to layer thickness variations and/or with a pitch which is robust (i.e., less sensitive) to layer thickness variations. In particular, subsegmentation of an alignment mark may be used to control the sensitivity of the aligned position to layer thickness variations. As such, by choosing an appropriate subsegmentation, it is possible to make a mark, e.g., robust for layer-thickness variations for a given stack.

FIG. 9 illustrates some examples of subsegmentation, where the mark has a grating structure that includes a plurality of mark segments (e.g., a vertical sub-segmented grating or a horizontal sub-segmented grating), and where one or more of the mark segments includes a plurality of subsegments. Subsegmentation to reduce layer and/or stack thickness variation is described in U.S. patent application No. 62/914,618, which is incorporated herein by reference. The subsegmented grating can be characterized by one or more subsegmentation variables (e.g., a pitch, duty cycle, line width and/or combination thereof). It is proposed in this embodiment, that the plurality of subsegments may be configured with a pitch, duty cycle, line width and/or combination thereof which minimizes sensitivity to layer thickness. Sensitivity to layer thickness may describe, for example, one or both of a change in a wavelength of a reflected beam with respect to the wavelength of an incident radiation as a function of a change in thickness of the stack and/or layer; and a change in the angular reflectance of the reflected beam as a function of a change in thickness of the stack and/or layer, the reflected beam being a beam reflected from the metrology mark and passing through the stack/layer.

Figure 9A:
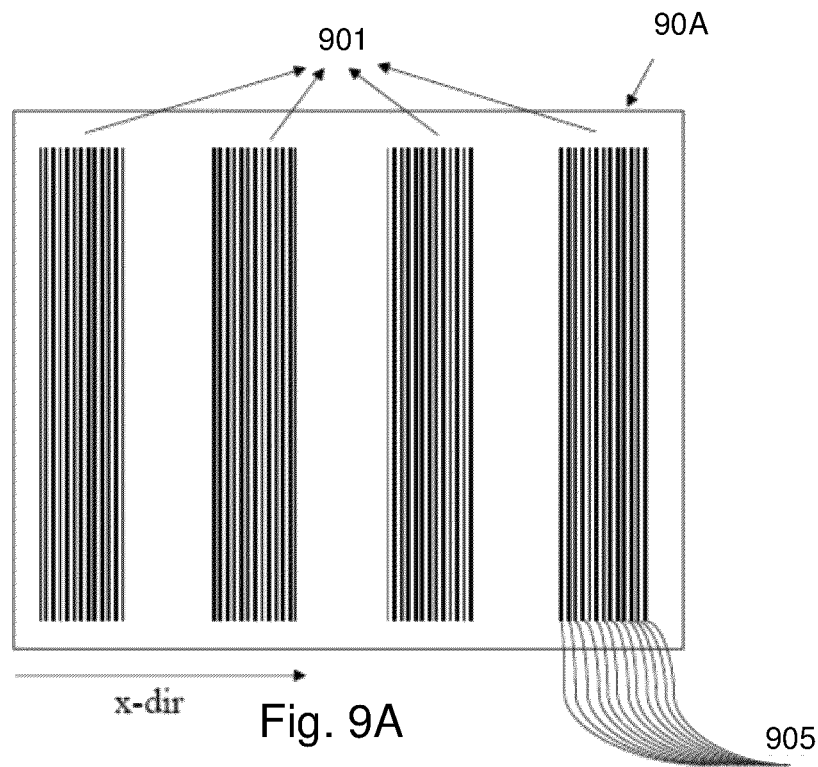
FIG. 9A illustrates a design of a vertical subsegmented grating structure for the metrology mark, which may be used in an embodiment.
Figure 9B:
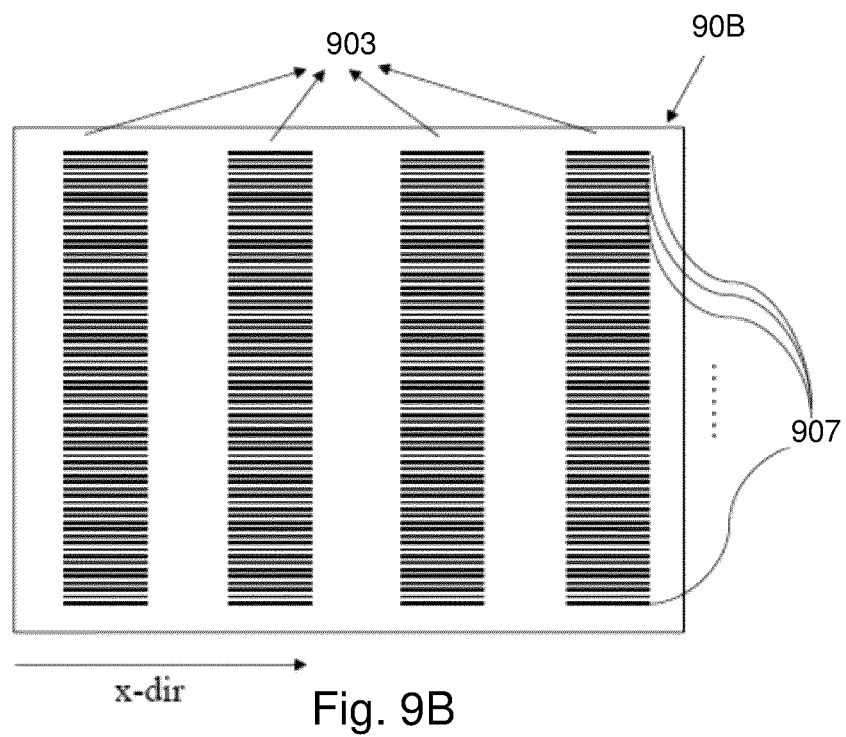
FIG. 9B illustrates a design of a horizontal subsegmented grating structure for the metrology mark, which may be used in an embodiment.
Figure 9C:
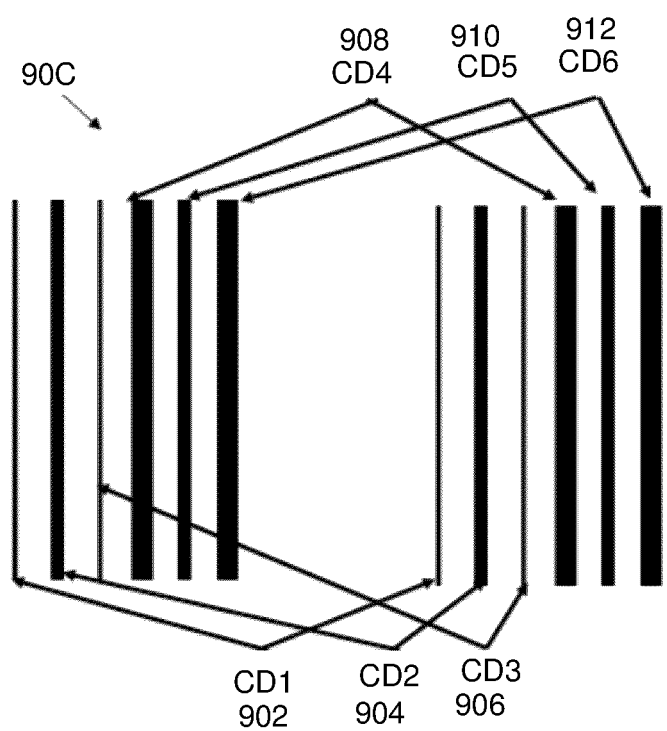
FIG. 9C illustrates an example design of a subsegmented grating structure with a constant pitch and different line widths of the subsegmented grating structure for the metrology mark, which may be used in an embodiment.

In FIG. 9A, an example first alignment mark 90A (e.g., an alignment mark) includes mark segments 901. This first alignment mark 90A is also referred a vertically sub-segmented grating. FIG. 9B illustrates an example second alignment mark 90B including mark segments 903. This second alignment mark 90B is also referred as a horizontally sub-segmented grating. In FIGS. 9A and 9B, each of the mark segments 901 and 903 are sub-segmented. In particular, the mark segments 901 are vertically sub-segmented, wherein the mark segments 901 are sub-segmented into sub-segments 905 that run perpendicular to a main grating direction (e.g., x-direction in FIG. 9A). On the other hand, mark segments 903 are horizontally sub-segmented, wherein the mark segments 903 are sub-segmented into sub-segments 907 that run parallel to or along the main grating direction (e.g., x-direction in FIG. 9B). The mark segments 901 and 903, shown as parallel lines, are examples and does not limit the scope of the present disclosure. It can be understood by a person skilled in the art that the scope of the present disclosure is not limited to a particular orientation or geometric shape of the mark segments. In some embodiments, subsegments can be dashed lines, rectangular lines, triangles, etc. FIG. 9C illustrates another example of an alignment mark 90C. The alignment mark 90C includes subsegments 902, 904, 906, 908, 910, and 912. Each of the subsegments 902, 904, 906, 908, 910, and 912 has different line widths (e.g., CD1, CD2, CD3, CD4, CD5, and CD6, respectively.) Each of the subsegments 902, 904, 906, 908, 910, and 912 may be repeated with the constant pitch in the alignment mark.

Determining reference marks which are less sensitive to layer thickness may be done in a pre-calibration stage (e.g., determined from earlier calibrations and/or modeling as already mentioned).

Such a pre-calibration may comprise:
a) perturbing one or more of the subsegmentation variables (e.g., pitch, duty cycle, and/or line width of the plurality of subsegments);
b) perturbing a thickness of one or more layers within the layer stack;
c) determining an updated sensitivity value based upon the perturbations of b) and c); and
d) iteratively performing steps a), b) and c) until a minimized sensitivity is determined to set a configuration for the plurality of subsegments. The sensitivity may be considered to be minimized, for example, after a specific number of iterations, or when the sensitivity breaches a predetermined low threshold value.

It is expected that the concepts disclosed herein will find particular application for the sensor of a type illustrated in FIG. 5, as this has a relatively large spot size in the pupil plane and a corresponding higher-order intensity variation. However it may be applicable to any suitable (image based) alignment sensor, particularly for difficult stacks which show greater intensity variation.

The description above has concentrated on diffraction-based alignment applications. However, it will be appreciated that the concepts described herein are also equally applicable to image-based alignment systems such as described in the prior published applications US2008043212A1 (Shibazaki) and US2011013165A1 (Kaneko). The disclosure of those prior applications is hereby incorporated herein by reference. In each case a pupil image can be obtained from a pupil plane of the image-based system and an intensity term determined from the pupil image using, for example, an intensity term similar to Equation (2), although it will not be the pixels of a diffraction order but of any part of the pupil (or the whole pupil)

comprising scattered radiation. Equation (1) can then be applied in the same manner as described, with suitably calibrated sensor term.

The description above has concentrated on alignment applications for positioning a substrate (e.g., within a lithography apparatus/scanner, metrology apparatus or any other processing apparatus). In such applications, the target is commonly referred to as an alignment mark, and the metrology device referred to as an alignment sensor (such as illustrated in FIG. 3). It is to be appreciated that the concepts disclosed herein are applicable to any optical metrology application suffers from stack/processing dependent errors. This may comprise overlay or focus metrology (or other parameter of interest) and therefore measure overlay or focus targets (whether dedicated targets or target areas of product structures). In fact, the device illustrated in FIG. 5 has many applications including inter alia overlay and focus metrology. The skilled person will be able to readily adapt the teaching above for such other applications. For example, any reference to an alignment position may be substituted with an overlay/focus value or value for intensity asymmetry (or any other parameter which shows an undesired stack dependency).

In the above, the sensor term or sensor model is described as ideally describing the sensor aberrations. It may be appreciated that this term is a data driven parameter which may not necessarily relate to sensor parameters which are apparent in a physical sense.

While specific embodiments of the invention have been described above, it will be appreciated that the invention may be practiced otherwise than as described.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 1-100 nm), as well as particle beams, such as ion beams or electron beams.

The term "lens" and "objective", where the context allows, may refer to any one or combination of various types of optical components, including refractive, reflective, magnetic, electromagnetic and electrostatic optical components. Reflective components are likely to be used in an apparatus operating in the UV and/or EUV ranges.

The breadth and scope of the present invention should not be limited by any of the above-described exemplary embodiments, but should be defined only in accordance with the following claims and their equivalents.

The invention claimed is:

1. A method of metrology comprising:
   obtaining, using a sensor having sensor optics, a pupil plane measurement dataset at a pupil plane relating to scattered radiation resultant from a measurement of a structure, wherein the pupil plane measurement dataset comprises an intensity distribution;
   obtaining a sensor term from calibration data, wherein the sensor term corresponds to the sensor optics used to perform the measurement;
   processing the intensity distribution to obtain an intensity term; and
   determining a correction term for a pupil plane measurement using the intensity term and the sensor term or determining a measurement value using the pupil plane measurement, sensor term, and intensity term;
   wherein the sensor term and intensity term correspond to at least one scattering angle at a position in the pupil plane within an angle range comparable with an angular spread of light propagating in an optical system.

2. The method of claim 1, wherein the method of metrology comprises a method of position metrology in aligning an object, and the measurement value comprises an alignment value.

3. The method of claim 1, wherein the determining comprises applying a linear regression model to the intensity term and the sensor term.

4. The method of claim 1, wherein the sensor term relates to aberration in the sensor optics as a function of position in the pupil plane.

5. The method of claim 1, wherein the intensity distribution comprises an intensity distribution within the pupil plane relating to a single higher diffraction order.

6. The method of claim 5, wherein the determining is preformed separately for each diffraction order of a corresponding pair of higher diffraction orders and further comprises averaging the results corresponding to each respective diffraction order to obtain the measurement value or correction therefor.

7. The method of claim 1, wherein the intensity distribution comprises an intensity distribution within the pupil plane describing a distribution of averages of pairs of corresponding pixels, the pairs of corresponding pixels comprising a first pixel in a first diffraction order of a corresponding pair of higher diffraction orders and a corresponding second pixel in a diffraction order of the corresponding pair of higher diffraction orders.

8. The method of claim 7, wherein the pairs of corresponding pixels comprise pixels in symmetrically opposite locations within the pupil plane.

9. The method of claim 7, wherein the intensity distribution takes into account a symmetry of the sensor.

10. The method of claim 9, wherein the pairs of corresponding pixels comprise pairs of pixels that interfere to generate a fringe pattern imaged in performing the measurement, the measurement value being derived from the fringe pattern.

11. The method of claim 10, wherein the pairs of corresponding pixels comprise pixels in symmetrically opposite locations within the pupil plane.

12. The method of claim 10, wherein the pairs of corresponding pixels comprise pairs of pixels having a corresponding displacement within the pupil plane with respect to respective chief rays.

13. The method of claim 1, wherein the intensity distribution comprises a normalized intensity distribution.

14. The method of claim 1, comprising projecting the pupil plane measurement dataset on a suitable basis to reduce a dimensionality of the determining.

15. The method of claim 14, wherein the suitable basis comprises Zernike polynomials.

16. The method of claim 1, comprising an initial calibration step to calibrate the sensor term for the sensor optics.

17. The method of claim 16, wherein the calibration step comprises:
   obtaining diverse calibration pupil datasets using the sensor optics; and
   performing an inversion to calibrate the sensor term from the pupil plane measurement dataset derived from each calibration pupil dataset.

18. The method of claim 17, wherein the diverse calibration pupil datasets comprise respective known measurement values or known corrections therefor and the step of performing an inversion further uses the respective known measurement values or known corrections therefor.

19. The method of claim 17, wherein the diverse calibration pupil datasets relate to measurements of a calibration structure of interest measured on a calibration substrate, the calibration substrate also comprising one or more calibration reference structures with known and/or low sensitivity characteristics; and the calibration step further comprises:
   determining measurement value offset data describing offsets between a measurement value for the calibration structure of interest and measurement values for each of the one or more calibration reference structures; and
   using the determining measurement value offset data in the step of performing an inversion.

20. The method of claim 19, wherein the one or more calibration reference structures comprise one or more parameter values chosen to minimize sensitivity to layer thickness.

21. The method of claim 20, wherein the one or more parameter values chosen to minimize sensitivity to layer thickness relate to one or both of:
   a subsegmentation of the structure or features thereof, and
   periodicity or pitch of repeated features of the structure.

22. The method claim 17, wherein the method comprises obtaining diverse calibration image plane datasets corresponding to at least a subset of the diverse calibration pupil datasets; and
   using the diverse calibration image plane datasets in the step of performing an inversion to calibrate the sensor term.

23. The method of claim 22, wherein effects in the diverse calibration image plane datasets attributable at least partly to crosstalk from surrounding structures adjacent the structure are correlated to corresponding effects in the diverse calibration pupil datasets, so as to distinguish these effects when performing the inversion.

24. The method of claim 22, wherein each of the diverse calibration image plane datasets comprise sets of one or both of:
   an intensity value or distribution measured at an image plane; and
   local fringe amplitude and/or fringe phase relating to surrounding structures, measured at an image plane.

25. The method of claim 22, wherein the step of performing an inversion further comprises inverting for the sensor term: a function comprising a first term comprising the sensor term and the diverse calibration pupil datasets and a second term comprising the sensor term and the diverse calibration image plane datasets, so as to optimize the sensor term in terms of correcting the calibration pupil plane datasets.

26. The method of claim 1, wherein the pupil plane measurement dataset relates to regions other than one or more diffraction orders from the structure; the determining step also using this additional pupil plane measurement dataset.

27. The method of claim 1, comprising performing the measurement to obtain the pupil plane measurement data and measurement value.

28. The method of claim 1, wherein the measurement value and the pupil plane measurement dataset each relate to different respective wavelengths, and/or polarizations of measurement radiation and/or repetition directions of a repeating pattern of the structure.

29. A computer program comprising computer readable instructions operable to perform the method of claim 1.

30. A processor and associated storage medium, the storage medium comprising the computer program of claim 29.

31. A metrology device comprising the processor and associated storage medium of claim 30.

32. A lithographic apparatus comprising the metrology device of claim 31.

33. The lithographic apparatus of claim 32, comprising:
   a patterning device support for supporting a patterning device; and
   a substrate support for supporting a substrate,
   wherein the metrology device is operable to determine an aligned position for one or both of the patterning device support and substrate support.

* * * * *

UNITED STATES PATENT AND TRADEMARK OFFICE
CERTIFICATE OF CORRECTION

| | |
|---|---|
| PATENT NO. | : 12,025,925 B2 |
| APPLICATION NO. | : 17/773384 |
| DATED | : July 2, 2024 |
| INVENTOR(S) | : Alpeggiani et al. |

It is certified that error appears in the above-identified patent and that said Letters Patent is hereby corrected as shown below:

In the Claims

In Column 25, Claim 22, Line 36, after "method" insert -- of --.

In Column 26, Claim 24, Line 2, delete "comprise" and insert -- comprises --, therefor.

Signed and Sealed this
Fifth Day of November, 2024

Katherine Kelly Vidal
*Director of the United States Patent and Trademark Office*